(12) United States Patent
Xu et al.

(10) Patent No.: US 7,622,149 B2
(45) Date of Patent: Nov. 24, 2009

(54) REACTIVE METAL SOURCES AND DEPOSITION METHOD FOR THIOALUMINATE PHOSPHORS

(75) Inventors: Yue (Helen) Xu, Burlington (CA); Alexander Kosyachkov, Mississauga (CA); Guo Liu, Brampton (CA); Xingwei Wu, Brampton (CA); Joe Acchione, Caledon (CA)

(73) Assignee: Ifire IP Corporation, Oakville, Ontario (CA)

( * ) Notice: Subject to any disclaimer, the term of this patent is extended or adjusted under 35 U.S.C. 154(b) by 649 days.

(21) Appl. No.: 11/072,824

(22) Filed: Mar. 4, 2005

(65) Prior Publication Data

US 2005/0202162 A1 Sep. 15, 2005

Related U.S. Application Data

(60) Provisional application No. 60/549,552, filed on Mar. 4, 2004.

(51) Int. Cl.
*B05D 5/06* (2006.01)
*C23C 14/00* (2006.01)

(52) U.S. Cl. ............... 427/70; 427/248.1; 427/69; 427/250; 427/593; 427/124

(58) Field of Classification Search ............ 427/64, 427/69, 457
See application file for complete search history.

(56) References Cited

U.S. PATENT DOCUMENTS

| | | | |
|---|---|---|---|
| 5,432,015 A | 7/1995 | Wu et al. | |
| 5,505,986 A | 4/1996 | Velthaus et al. | |
| 6,074,575 A | 6/2000 | Sugioka et al. | |
| 6,447,654 B1 * | 9/2002 | Kosyachkov | 204/192.15 |
| 6,597,108 B2 | 7/2003 | Yano et al. | |
| 6,736,947 B1 * | 5/2004 | Watanabe et al. | 204/298.13 |
| 6,793,782 B2 | 9/2004 | Kosyachkov | |
| 2002/0060325 A1 * | 5/2002 | Yano et al. | 257/103 |
| 2002/0064682 A1 | 5/2002 | Yano et al. | |
| 2002/0192501 A1 | 12/2002 | Yano et al. | |
| 2003/0000829 A1 | 1/2003 | Kosyachkov | |
| 2003/0087129 A1 | 5/2003 | Miura et al. | |

(Continued)

FOREIGN PATENT DOCUMENTS

EP 0667383 A2 8/1995

(Continued)

OTHER PUBLICATIONS

International Search Report, PCT/CA2005/000333, Mailed May 30, 2005, Authorized Officer Michael M. Morgovsky.

(Continued)

*Primary Examiner*—David Turocy
(74) *Attorney, Agent, or Firm*—Fay Sharpe LLP

(57) ABSTRACT

A physical vapor deposition method for the deposition of thioaluminate phosphor compositions includes providing one or more source materials including an intermetallic barium aluminum compound, a barium aluminum alloy or a protected barium metal, providing an activator species and effecting deposition of the one or more source materials and activator species as a phosphor composition on a selected substrate. The method allows for the deposition of blue thin film electroluminescent phosphors with high luminance and colors required for TV applications.

45 Claims, 4 Drawing Sheets

U.S. PATENT DOCUMENTS

| | | |
|---|---|---|
| 2003/0118864 A1 | 6/2003 | Kosyachkov |
| 2003/0146691 A1 | 8/2003 | Yano et al. |
| 2003/0184216 A1 | 10/2003 | Yano et al. |
| 2003/0224221 A1 | 12/2003 | Cheong et al. |
| 2005/0142289 A1* | 6/2005 | Stiles et al. .............. 427/248.1 |

FOREIGN PATENT DOCUMENTS

| | | |
|---|---|---|
| EP | 0720418 A1 | 7/1996 |
| WO | WO9934028 | 7/1999 |
| WO | 03056056 A2 | 7/2003 |
| WO | 2005087971 A1 | 9/2005 |

OTHER PUBLICATIONS

European Search Report, Appl. No. 05714575.7-1215/1721026 PCT/CA2005000333; Completed Sep. 1, 2009; The Hague; Examiner Caroline Castagne.

* cited by examiner

REACTIVE METAL SOURCES AND DEPOSITION METHOD FOR THIOALUMINATE PHOSPHORS

CROSS REFERENCE TO RELATED APPLICATIONS

This application claims the benefit of the filing date of U.S. Provisional Patent Application No. 60/549,552, filed Mar. 4, 2004.

BACKGROUND

The present embodiments relate to the deposition of phosphor materials in full colour ac thick film dielectric electroluminescent displays. More specifically, they are directed to a novel physical vapour deposition method for depositing thioaluminate thin film phosphor compositions using one or more source materials that comprise barium.

Thick film dielectric structures as described in U.S. Pat. No. 5,432,015 (the disclosure of which is incorporated herein by reference in its entirety) provide superior resistance to dielectric breakdown as well as a reduced operating voltage as compared to thin film electroluminescent (TFEL) displays. The thick film dielectric structure as deposited on a ceramic substrate will withstand somewhat higher processing temperatures than TFEL devices, which are typically fabricated on glass substrates. This increased high temperature tolerance facilitates annealing of phosphor films at higher temperatures to improve their luminosity. However, even with this enhancement, it is still desirable to improve display luminance and colour co-ordinates to keep pace with ongoing improvements to cathode ray tube (CRT) displays, particularly with recent trends in CRT specifications to higher luminance and higher colour temperature.

A high luminance blue-emitting electroluminescent phosphor is desirable in electroluminescent colour displays to achieve adequate luminosity. Cerium activated strontium sulfide has traditionally been selected as the blue light emitting phosphor material for full colour electroluminescent displays. However, the optical emission from this phosphor material must be passed through an appropriate chromatic filter to achieve the necessary colour co-ordinates for blue sub-pixels, resulting in a loss of luminance and energy efficiency. While cerium activated strontium sulfide phosphors have a relatively high energy conversion efficiency for blue emission of 1 lumen per watt, their spectral emission is quite wide ranging from blue to green necessitating the use of the optical filters. While the spectral emission of such phosphors can be shifted to some degree towards the blue by controlling the deposition conditions and activator concentration, it is not to the extent required to eliminate the need for an optical filter.

Alternative blue phosphor materials such as cerium activated alkaline earth thiogallate compounds have narrower emission spectra tuned to provide the colour co-ordinates required for blue sub-pixels. These compounds provide good blue colour co-ordinates, but have relatively poor luminosity and stability. Since the host materials are ternary compounds, it is relatively difficult to control the stoichiometry of the phosphor films. Europium activated barium thioaluminates provide excellent blue colour co-ordinates and higher luminance, but as a ternary compound, its stoichiometry is also somewhat difficult to control. Vacuum deposition of barium thioaluminate phosphor films comprising this material from a single sulfide source pellet using sputtering or electron beam evaporation has not yielded films with adequately high luminosity.

Improved luminance of barium thioaluminate phosphors has been achieved by using a hopping electron beam deposition technique to deposit films from two source pellets, one comprising barium sulfide doped with europium and the other comprising aluminum sulfide. The stoichiometry of the deposited film is controlled by controlling the relative dwell time of the electron beam impinging on each of the two source materials. However, this technique is not readily scalable to facilitate commercial production of large area displays and the process cannot be adequately controlled to compensate for changes in the evaporation rates from the two sources as the deposition proceeds and the source pellets are depleted.

The stoichiometry of thioaluminate phosphors can be improved using more than one electron beam impinging on each source for the deposition. This approach requires added controls over the relative deposition rates for the different sources. Furthermore, the required relative evaporation rates must be calibrated for each specific piece of deposition equipment and the requirement for multiple sources constrains the design of the deposition equipment, which generally adds to the cost of the equipment. Lastly, certain known evaporation methods are not well suited for the deposition of large area films such as a required for the fabrication of large electronic displays such as those for the wall television application.

U.S. Pat. No. 6,447,654 discloses the sputtering of barium thioaluminate phosphor films from a single target comprising aluminum sulfide and barium sulfide to deposit blue-emitting barium magnesium thioaluminate phosphor materials. The stoichiomentry of the deposited film is adjusted by adjusting the target composition to account for differential condensation rates of the target elements on the phosphor film substrate. However, this method does not fully solve the problem of providing a stable phosphor film during display operation and at the same time providing a method that can be used for the economic deposition of phosphor films over large areas.

The Applicant's co-pending U.S. patent application Ser. No. 10/036,559 discloses the sputtering of two targets to deposit a rare earth activated barium thioaluminate phosphor film. One of the sputtering targets comprises aluminum while the other sputtering target comprises europium doped barium sulfide. The sputtering is carried out in a low pressure atmosphere of hydrogen sulfide to provide sufficient sulfur content in the deposited film. The use of two sputtering targets facilitates modulation of the relative deposition rate of materials arising from each source which in turn facilitates deposition of a laminated film with a periodic composition alternately rich and poor in aluminum. The variation can be achieved by using a rotating or oscillating substrate that is alternately positioned in the flux of atomic species sputtered from the respective targets.

To the extent that the atomic flux from the two sources are spatially separated from one another, and to the extent that hydrogen sulfide is present in the sputtering chamber, a film can be deposited with a composition that is alternately aluminum sulfide and rare earth doped barium sulfide. The thickness of the layers can be altered by changing the rotation rate or the oscillation rate of the substrate. In this method, however, the composition modulation across the thickness of the deposited layer is problematical for subsequent reaction of the deposited materials to form a homogeneous single phase phosphor material, since atomic species are required to diffuse within the deposited film to achieve a homogeneous composition on an atomic scale.

It is therefore desirable to develop an efficient method for the deposition of thin film phosphor compositions for thick film dielectric electroluminescent displays that obviates one or more of the disadvantages of the prior art methods.

BRIEF SUMMARY

The present embodiments relate to a physical vapour deposition method for the deposition of thioaluminate phosphor compositions, and in particular, for the deposition of barium thioaluminate thin film phosphor compositions for full colour ac electroluminescent displays particularly those employing thick film dielectric layers with a high dielectric-constant. The present method reduces the degree of control required to preserve the purity of the source material(s) for the deposition and improves the luminance and emission spectrum of these phosphor materials as used for full colour ac electroluminescent displays. As such, the present method allows for the deposition of large area multi-element thin films for electroluminescent phosphors that provide a high, yet uniform, luminosity and a suitable emission color.

According to an aspect of the present embodiments, there is provided a physical vapour deposition method for the deposition of thioaluminate phosphor compositions, the method comprising: providing one or more source materials comprising an intermetallic barium aluminate compound, a barium aluminum alloy or a protected barium metal;—providing an activator species; and effecting deposition of said source materials and said activator species as a phosphor composition on a selected substrate.

In one embodiment, the physical vapour deposition method is effected in a sulfur-bearing vapour atmosphere. In other aspects, a combination of different source materials may be used in the method.

According to another aspect, there is provided a physical vapour deposition method for the deposition of thioaluminate phosphor compositions, the method comprising: providing one or more source materials comprising an intermetallic barium aluminate compound, a barium aluminum alloy, a protected barium metal and combinations thereof; providing an activator species to said one or more source materials or separately; and effecting deposition of said source materials and said activator species in a sulfur-bearing vapour atmosphere as a phosphor composition on a selected substrate.

According to yet another aspect, there is provided a physical vapour deposition method for the deposition of a barium thioaluminate phosphor composition, the method comprising: providing a source material comprising a barium aluminum intermetallic compound; providing an activator species; and effecting deposition of said source material and said activator species in a sulfur-bearing vapour atmosphere as a phosphor composition on a selected substrate.

According to still another aspect of the present embodiments, there is provided a physical vapour deposition method for the deposition of a barium thioaluminate phosphor composition, the method comprising: providing a source material comprising $BaAl_4$ and an activator species; and effecting deposition of said source materials and said activator species in a sulfur vapour atmosphere as a phosphor composition on a selected substrate.

Other features and advantages of the present embodiments will become apparent from the following detailed description. It should be understood, however, that the detailed description and the specific examples while indicating embodiments are given by way of illustration only, since various changes and modifications within the same spirit and scope will become apparent to those skilled in the art from said detailed description.

BRIEF DESCRIPTION OF THE DRAWINGS

The present embodiments will become more fully understood from the description given herein, and from the accompanying drawings, which are given by way of illustration only and do not limit the intended scope.

DETAILED DESCRIPTION

Figure 1:
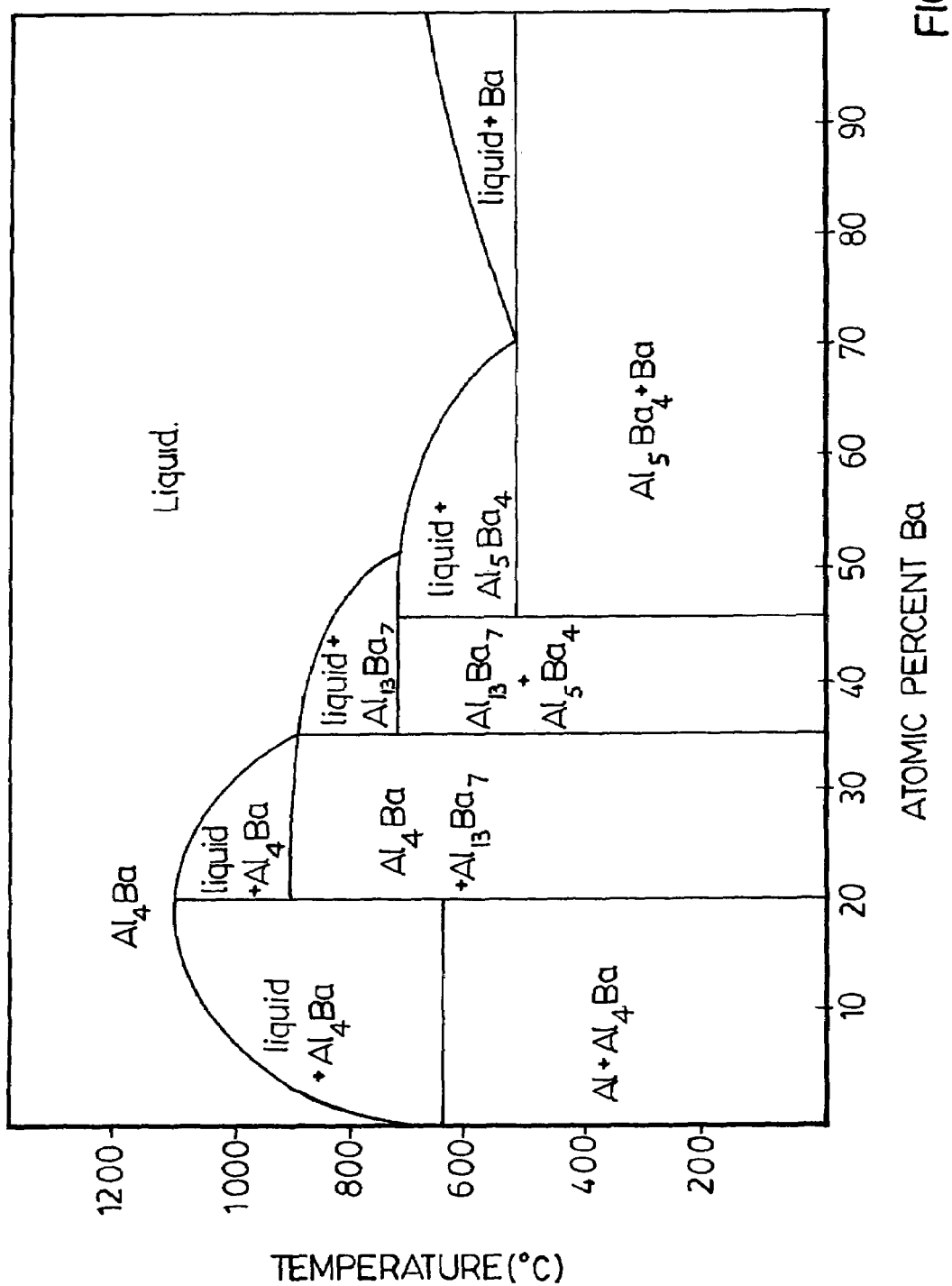
FIG. 1 shows a drawing of the binary phase diagram for barium and aluminum.

Described herein is a novel method for the deposition of thioaluminate phosphor compositions for use in electroluminescent displays, and in particular, electroluminescent displays employing thick film dielectric layers. The method described is a physical vapour deposition method that is well suited to deposit blue light emitting phosphors such as rare earth activated barium thioaluminates. The method provides for the deposition of phosphors with improved luminance and emission spectrum used within electroluminescent displays. The method is also relatively simple and is applicable for the economic deposition of phosphor films over large areas.

The method described is a physical vapour deposition method that can be selected from sputtering or thermal evaporation and utilizes one or more source materials to deposit a thioaluminate phosphor composition. As a sputtering method, the method employs one or more metallic sputtering targets as the source material(s). As a thermal evaporation method, the method employs one or more evaporation pellets as the source material(s). The sputtering targets or evaporation pellets comprise a barium aluminum alloy, a barium aluminum intermetallic compound a protected barium metal or combinations thereof. In the method, an activator species selected to provide the desired light emission colour is also added to the one or more source materials. Alternatively, the activator species can be provided separately from the one or more source materials. Suitable activator species include rare earth metals such as europium and cerium.

According to a first aspect, the source material(s) for use in the present method may be a barium aluminum alloy used as the sputtering target or evaporation pellet. The use of barium aluminum alloys simplifies controlling the vapour species removed from the targets or pellets due to their simple chemical composition. Prior art methods for depositing europium activated thioaluminate compositions use targets or pellets comprising aluminum sulfide and/or barium sulfides doped with europium. The vapour species that emanate from pellets or targets of europium doped barium sulfide may comprise EuS, Eu, BaS, Ba, or $S_2$ depending on the evaporation temperature or sputtering conditions. Similarly, the vapour species that emanate from aluminum sulfide may comprise AlS, $AlS_2$, $Al_2S_2$, Al or $S_2$. The type and relative flux of these various species that emanate may vary with fluctuations in the sputtering power, sputtering atmosphere, or pellet temperature for thermal evaporation, creating fluctuations in the composition of the deposited film due to the different sticking coefficients for the various vapour species. By contrast, in the present embodiments, desirably the only species that can emanate from the pellets or targets are elemental Ba, Al and Eu vapours.

The barium aluminum alloy is a composition represented by the chemical formula $Ba_xAl$ where x is in the range of about 0.15 to about 0.45 and in certain aspects is in the range of about 0.20 to about 0.35. Additional sputtering targets or evaporation pellets and a sulfur-bearing process gas such as hydrogen sulfide may also be used within the deposition chamber to make up the balance of the composition of the deposited phosphor film composition. The additional source materials (targets/pellets) may comprise aluminum metal or aluminum sulfide compounds. The activator species is selected from a rare earth element such as europium or cerium and may be incorporated into the barium aluminum alloy source material or into any of the additional source materials used to make up the desired composition of the deposited phosphor film composition. The barium aluminum alloy source material may be made into a composite source material by incorporation into an aluminum metal in a manner described in Applicant's co-pending provisional Patent Application Ser. No. 60/433,576 (the disclosure of which is incorporated herein in its entirety).

According to a further aspect of the present embodiments the source material(s) is an intermetallic barium compound such as $BaAl_4$, $Ba_7Al_{13}$ or $Ba_4Al_5$. Such an intermetallic compound helps to prevent the barium from reacting quickly in air to form barium oxide, barium hydroxide or barium carbonate as the barium is sequestered within the crystal structure of the intermetallic compound. An activator species selected to provide the desired light emission colour is also added to the intermetallic compound. The barium aluminum intermetallic compound may comprise $BaAl_4$, $Ba_7Al_{13}$ or $Ba_4Al_5$. Additional source materials and a sulfur-bearing process gas for a reactive thermal evaporation process are used to make up the balance of the composition of the deposited film. The additional source materials required to make up the deposited film composition may comprise aluminum metal or aluminum sulfide.

According to yet a further aspect the source material is a protected barium metal that prevents the barium metal from reacting quickly in air to form barium oxide, barium hydroxide or barium carbonate. The protective mechanism may be to encapsulate the barium metal in a non-reactive matrix such as aluminum as discussed supra such that the barium aluminum alloy and the aluminum metal would form a composite source material similar to that described in Applicant's U.S. Provisional Patent Application Ser. No. 60/433,576 (the disclosure of which is hereby incorporated by reference in its entirety). In this manner, a single source material can be used to deposit a thioaluminate film by reactive sputtering. However, in this case, it should be ensured that the barium does not sputter or evaporate at a rate different than the aluminum, to prevent the target composition from changing as it is eroded during the deposition process and consequently also change the composition of the deposited film.

The protected barium metal may also be a barium metal covered with a volatile passivating film to enable the pellet to be handled in air prior at its being positioned in the evaporation/deposition chamber. The passivating film may be a layer of a non-protic solvent or mixtures thereof that can be evaporated away in the vacuum chamber when it is evacuated as is understood by one of skill in the art. The vapour pressure of the passivating non-protic solvent should be sufficiently low to provide adequate working time in air to facilitate handling of the source material(s), but sufficiently high that it can be evaporated away when the deposition chamber is evacuated and heated without reacting with the barium. The passivating film may also comprise a dense layer of barium oxide, barium sulfate or other inert barium compound that provides adequate protection for the barium during handling in air, but that can be removed by heating of the source material(s) prior to the deposition of barium. The layer can be formed by exposing the barium to atmosphere or to an inert atmosphere containing low concentrations of oxygen, sulfur dioxide and/or hydrogen sulfide for a time sufficient to create a functional passivation layer.

The thickness of the passivating layer may vary from a few atomic diameters to a micrometer or more, depending on the desired functional properties of the passivation layer and the conditions under which the barium is to be handled prior to being evaporated in the deposition chamber. If the barium metal is handled in an ambient environment where the relative humidity is held as low as possible, the passivation layer may be made thinner. It is possible to control the working ambient atmosphere to a humidity as low as about 1% by using a dry-room with special dehumidification system that employs chemical absorption wheels that absorb moisture from recirculated and make-up air in a final dehumidification step as known in the general humidity control art.

The present method is suitable for the deposition of rare earth activated thioaluminate based phosphors and in aspects, for the deposition of rare earth activated barium thioaluminate thin film phosphors which emit a blue light. The value for x, the amount of barium, in the composition of the deposited phosphor film composition can be varied over the range from about zero to 0.53 corresponding to the nominal composition $Ba_7Al_{13}S_{26.5}$ by changing the composition of the barium alloy source material; by varying the relative deposition rate from the barium aluminum source material(s); and by the presence of any aluminum or aluminum sulfide source materials used in the method. Phosphor compositions that may be deposited by the disclosed method include but are not limited to $BaAl_4S_7$ and $BaAl_2S_4$ having an activator species incorporated therein.

The present method as a reactive sputtering deposition method can be done in any contemporary rf magnetron sputtering system such as those marketed by Edwards, Ulvac, Leybold, etc. that is fitted with a gas injection and exhaust system capable of handling hydrogen sulfide or other sulfur-containing vapours and has a deposition substrate heating means. Sputtering may be conducted at power levels of about 3 to 5 watts per $cm^2$. The method can also be conducted as a thermal evaporation method as is understood by one of skill in the art. The method may also be effected using electron beam evaporation as is also understood by one of skill in the art.

The phosphors as deposited by the present methods are incorporated within an electroluminescent device that may incorporate a variety of substrate structures. Such devices are disclosed for example in Applicant's U.S. Patent Publication No. 2003/0224221 (the disclosure of which is incorporated herein in its entirety). In particular, the substrate structure comprises a thick film ceramic material having a base substrate which is a ceramic sheet having an electrically conductive film deposited thereon with a thick film dielectric layer deposited on the film. Examples of suitable base substrates are ceramic sheet materials that include but are not limited to alumina, metal ceramic composites, glass ceramic materials and high temperature glass materials. Suitable electrically conductive films are known to those of skill in the art such as, but not limited to, gold and silver alloy. The thick film layer comprises ferroelectric material. Suitable ferroelectric materials may be selected from lead magnesium niobate titanate, lead zirconate titanate, barium titanate and mixtures thereof. The thick film layer may be as described in Applicant's co-pending PCT/CA02/01932 (the disclosure of which is incorporated herein by reference in its entirety). The thick film layer may also comprise one or more thin film layers thereon.

The deposition of the composition may be carried out in an atmosphere of $H_2S$, sulfur or other volatile sulfur bearing compounds such as with the use of a polysulfide compound to ensure that the deposited phosphor composition will not be deficient in sulfur. Deposition as conducted in a hydrogen sulphide atmosphere ensures that deposited species in the film can react with sulphide derived from the hydrogen sulphide to adequately saturate the deposited film with sulphide and achieve the desired film composition. However, it may be also be possible to operate the method in a low pressure sulfur vapour-containing atmosphere without $H_2S$. An oxygen-free environment may not be necessary.

In one representative embodiment, the method is a reactive sputtering deposition method for deposition of a barium thioaluminate phosphor film. The source material is a single sputtering target comprising a barium aluminum alloy having a composition $Ba_xAl$ where x is in the range of about 0.15 to about 0.45 and in certain aspect in the range of about 0.20 to 0.35 and that comprises the intermetallic compounds $BaAl_4$ and/or $Ba_7Al_{13}$. With reference to the binary phase diagram of FIG. 1, for the barium aluminum system, the minimum value for x corresponds to that of $BaAl_4$, so if the pellet or target is homogeneous, it can essentially consist of this intermetallic compound which has a crystal structure such that the crystal faces consist of aluminum atoms so that it is functionally unreactive towards air.

If the value for x is increased to the range between about 0.20 and about 0.35 the composition of the sputtering target can be a phase mixture of $BaAl_4$ and $Ba_7Al_{13}$ and/or $Ba_5Al_4$. This phase mixture can also be stable in air despite the relative instability in air of the $Ba_7Al_{13}$ intermetallic compound under air provided that the morphology of the mixture is such that the $Ba_7Al_{13}$ phase is encapsulated in a matrix of $BaAl_4$. Typically, this can be accomplished provided that the morphology of the target is such that the $Ba_7Al_{13}$ phase is present as a finely divided inclusion phase dispersed in a matrix phase comprising $BaAl_4$. This is feasible provided that x in the formula $Ba_xAl$ for the average composition is between about 0.25 and about 0.3.

If the value for x is less than 0.20, the source material can be a mixture of aluminum particles in a matrix of $BaAl_4$. This composition is somewhat less desirable than those with a higher value of x because the vapour pressure of aluminum is much higher than that of $BaAl_4$ such that bursts of aluminum may be sputtered or evaporated as the aluminum inclusions are exposed at the pellet or target surface. This causes inhomogeneity and excessive aluminum in the composition of the deposited film.

In another representative embodiment, the method is a thermal evaporation method of a barium thioaluminate phosphor film. In such method the source material is an evaporation pellet comprising the intermetallic compound $BaAl_4$. Since the barium is sequestered within the crystal structure of this compound, it can be handled in air.

The $BaAl_4$ source material will evaporate in such a manner as to preserve the ratio of barium to aluminum in the pellet and thereby provide a stable source material. This stability can be explained in terms of the behaviour of the material should there be a deviation from the $BaAl_4$ composition. If the composition is slightly aluminum rich, the pellet will consist of $BaAl_4$ containing a small quantity of aluminum metal as an inclusion phase. Provided the aluminum is not oxidized, it will evaporate more quickly than the $BaAl_4$, due to its higher vapour pressure bringing the composition of the pellet back to that of $BaAl_4$. Similarly, if the composition is slightly barium rich the pellet will consist of $BaAl_4$ containing a small quantity of $Ba_7Al_{13}$ as an inclusion phase which will also evaporate faster than the $BaAl_4$, again bringing the pellet composition back to $BaAl_4$.

In any of the embodiments described, to achieve the desired composition of the deposited barium thioaluminate phosphor film, additional source material(s) and a sulfur-bearing process gas for a reactive deposition process are used to make up the balance of the composition of the deposited film. The additional targets may comprise aluminum metal or aluminum sulfide if a more aluminum rich film is desired, or passivated barium metal or barium sulfide if a more barium rich film is desired.

In summary, there is provided a novel physical vapour deposition process for depositing multi-element thin phosphor film compositions for electroluminescent displays in which the phosphors have a high, yet uniform luminosity and suitable emission colour. The method incorporates the use of one or more source materials, where such source material(s) comprise an intermetallic barium aluminum compound, a barium aluminum alloy or a protected barium aluminum metal.

The above disclosure generally describes the present embodiments. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

Example 1

A cylindrical barium aluminum sputtering target of diameter 7.6 cm and thickness of 6 mm with a composition of 47.5 atomic percent barium, 47.5 atomic percent aluminum and 5 atomic percent europium was prepared (ACI Alloys of San Jose, Calif.). The target was used in an Edwards model FL400 rf magnetron sputtering system as the sole source of barium, aluminum and europium to reactively sputter a europium doped thioaluminate film under a gas pressure of 0.2 to 0.5 Pascals.

Several electroluminescent devices were fabricated with phosphor films deposited using the sputtering system described above. The sputtering process gas was an argon hydrogen sulfide mixture introduced into the sputtering chamber during film deposition with the ratio of argon to hydrogen sulfide in the gas mixture ranging from 1:1 to 4:1. The rf power applied to the sputtering target for the depositions was 200 watts.

The deposition substrates were 5 cm by 5 cm glass substrates similar to those described U.S. patent application Ser. No. 10/326,777 (the disclosure of which is incorporated herein in its entirety) upon which several gold electrode pads were deposited. Following gold deposition, a thick dielectric structure as exemplified in U.S. patent application Ser. No. 09/540,288 (the disclosure of which is incorporated herein in its entirety) was deposited, followed by a 100 nm thick layer of barium tantalate deposited by sputtering.

The europium doped barium thioaluminate phosphors film were deposited to a thickness of about 400 nm and were subsequently annealed under nitrogen in a belt furnace at a peak temperature of about 750° C. for about 10 minutes. The phosphor films were then covered with a 50 nm thick layer of sputtered aluminum nitride followed by a layer of an indium tin oxide transparent electrode.

The devices were tested under the application of a repetitive alternative polarity pulsed voltage waveform having a pulse width of 40 microseconds, an amplitude in the range of 120 to 240 volts and a pulse repetition rate of 240 Hz. The tested devices were found not to exhibit electroluminescence. Energy dispersive x-ray analysis (EDX), uncorrected for sample thickness effects, showed that the deposited films were barium rich with an aluminum to barium ratio of about 1:3.5. This ratio was too low to form the desired thioaluminate phosphor materials and indicated that barium was preferentially sputtered from the phosphor sputtering target, as expected on the basis of the discussion above concerning the behaviour of composite barium aluminum targets.

Example 2

Figure 2:
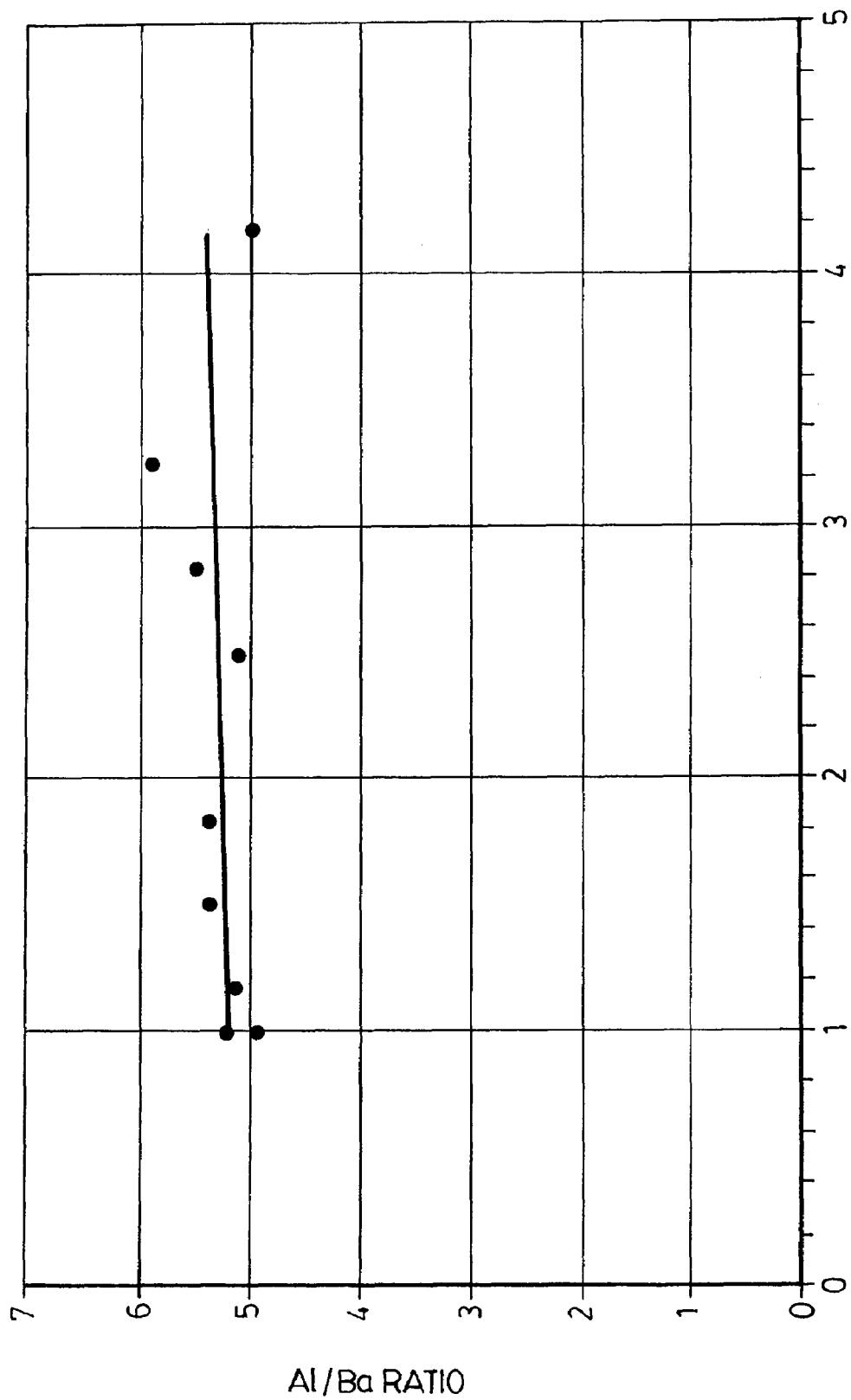
FIG. 2 shows the dependence of the luminance of electroluminescent devices made by sputtering of a barium thioaluminate phosphor film using different process gas compositions.

Electroluminescent devices similar to those of example 1 were prepared, except that the target composition for phosphor deposition was 17 atomic percent barium, 81 atomic percent aluminum and 2 atomic percent europium. These devices did exhibit electroluminescence under the test conditions of example 1. The concentration of elements in the deposited phosphor films as measured by energy dispersive x-ray analysis (EDX) on films deposited on silicon wafers placed immediately adjacent to the EL device substrates as a function of the ratio of argon to hydrogen sulfide in the process gas for phosphor sputtering is shown in FIG. 2. A complete chemical analysis of the phosphor films, also measured using EDX on films deposited on silicon wafers, is shown for several devices incorporating thick film dielectric layers in Table 1. Table 1 also shows threshold voltage and the luminance and the CIE y colour co-ordinates of the devices measured at 60 volts above the threshold voltage, measured under the test conditions described in example 1.

As can be seen from the data, the ratio of aluminum to barium in the phosphor samples as measured by EDX, not corrected for sample thickness, was in the range of 1:4.9 to 1:5.4, close to that of the target composition. Similarly, the ratio of europium to barium is similar to that of the target composition. The luminance of the devices was in the range of 170 to 210 candelas per square meter, except notably for run numbers 1 and 2 which had the highest aluminum to barium ratios. The observed variation in luminance may be related to the observed differences in the chemical composition of the phosphor films.

Example 3

An electroluminescent device similar to that of example 1 was prepared, except that it had a 50 nm thick layer of barium tantalate between the thick film dielectric layer and the phosphor layer. Furthermore, the phosphor was deposited by thermal evaporation in a Dynavac box coater using a thermal source for barium and europium consisting of pellets of metallic barium of approximate dimension 2 to 5 mm that were alloyed with 6 atomic percent of europium and a second thermal source pellet consisting of pieces of aluminum sulfide of approximate dimension 2 to 10 mm. Prior to deposition, the deposition chamber was pumped down to a base pressure of $7 \times 10^{-3}$ Pa. Supplementary sulfur was provided in the deposition chamber by the injection of hydrogen sulfide at a rate of 150 sccm to maintain a working pressure of $3 \times 10^{-2}$ Pa during the deposition process. The barium source pellet was heated to melt these source materials.

The deposition chamber was fitted with a nitrogen cold trap as described in U.S. Provisional Patent Application Ser. No. 60/443,540 (the disclosure of which is incorporated herein in its entirety) to remove water and oxygen-containing vapour species from the vacuum chamber during the deposition. The phosphor film was deposited to a thickness of 400 nm at a rate of 6 Angstroms per second. Following deposition the device with the phosphor film deposited on it was heat treated under dry air with a dew point of −60° C. at a peak temperature of 720° C. for 2 minutes and then under nitrogen at a peak temperature of 770° C. for 5 minutes. A 50 nm thick aluminum nitride upper thin film dielectric layer and an indium tin oxide (ITO) optically transparent conductor layer were then deposited to complete the device. This and similar devices were tested using the method described in example 2 and exhibited a luminance of 400 to 800 candelas per square meter.

Example 4

This example demonstrates the feasibility of depositing a barium thioaluminate phosphor film by sputtering from two metallic targets, one of europium doped barium metal and the other of aluminum metal.

Several electroluminescent devices similar to that of example 1 were constructed on a glass substrate except that the thin film dielectric deposited on the thick dielectric layer prior to phosphor deposition consisted of two layers, the first being 160 to 170 nm of barium titanate and the second being 50 nm of barium tantalate. The phosphor was deposited and heat treated according to the following procedure.

Figure 3:
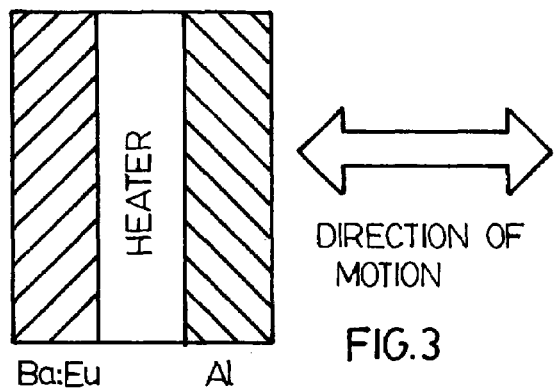
FIG. 3 shows a top view of a dual target sputtering assembly consisting of europium doped barium metal and aluminum metal sheets bonded to nickel-plated copper backing plates.

The europium-doped barium metal sheets were dried completely to remove protective solvent prior to bonding. The target was constructed in a dry argon-filled glove box by bonding an array of barium tiles with an overall dimensions 56 cm by 12 cm by 0.63 cm to a nickel-plated copper backing plate, and was vacuum bagged prior to installation in the deposition system. The barium metal was doped with 3 to 6 atomic percent europium. The pure aluminum metal target of the same dimensions was made of one piece, and also bonded to a nickel plated copper backing plate as shown in FIG. 3. The targets were mounted in a CPA2000 sputtering system with the ambient relative humidity below 20 percent and the deposition chamber was pumped down to a pressure of less than $10^{-4}$ Pa using a multiple pump system including a diffusion and a cryo pump.

An accumulated corrosion layer created during handling was removed from the barium and aluminum targets by pre-sputtering of the targets for several hours prior to the phosphor film deposition. The phosphor film was deposited onto the device substrate by reactive sputtering under an argon and hydrogen sulfide process atmosphere at a pressure in the range of 1 to 3 Pa using the diffusion pump. The argon was 99.999% pure and the hydrogen sulphide was 99.9% pure.

The ratio of argon to hydrogen sulfide was 1.5:1. The rf power applied to the europium doped barium target was between 1250 and 1500 watts and the rf power applied to the aluminum target was 2500 to 5000 watts.

The device substrate was heated to a temperature of between 200° C. and 400° C. and was passed back and forth in an oscillatory fashion at a rate of 42 centimeters per minute for between 9 and 12 complete cycles past the sputtered plumes from the two targets so that alternate layers of europium doped barium and aluminum were deposited on it. The thickness of the deposited phosphor was between 350 and 450 nm. Following deposition, the phosphor film was heat treated in a belt furnace under nitrogen at a peak temperature of 770° C. for 25 minutes, including the heating and cooling time.

Figure 4:
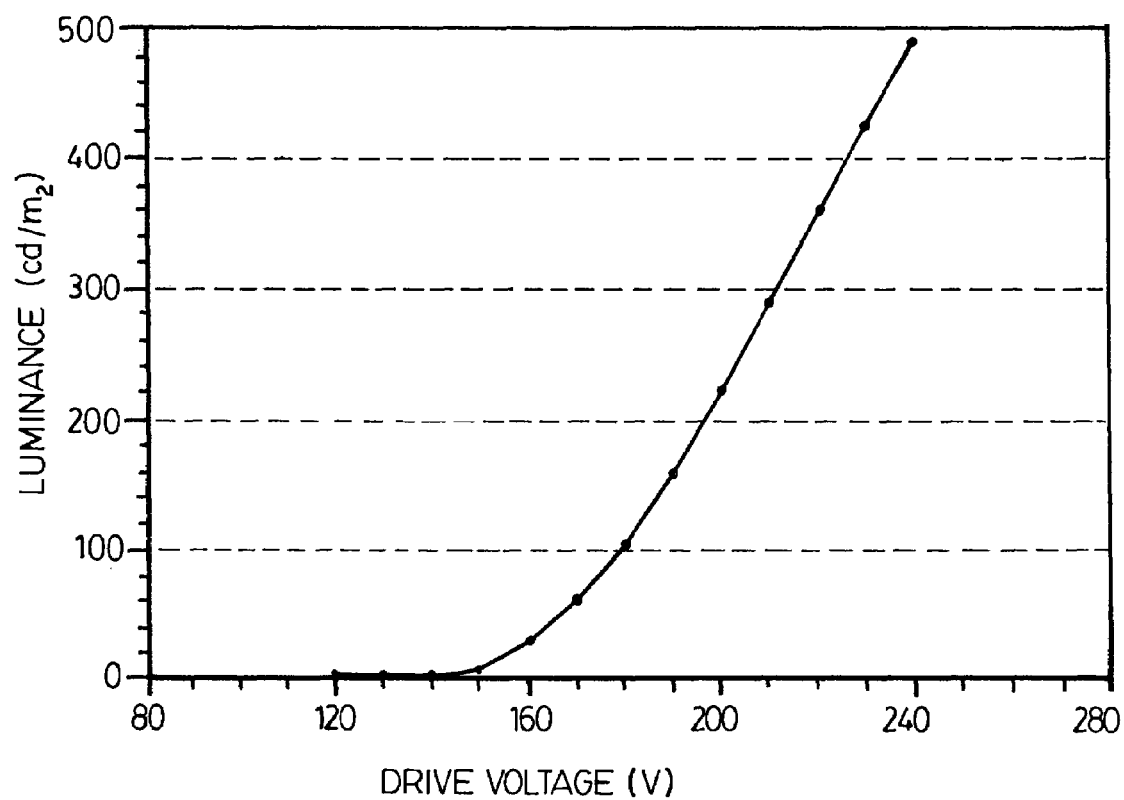
FIG. 4 is a graph showing the luminance of a thick film dielectric electroluminescent device comprising a phosphor film deposited in accordance with one embodiment as a function of the driving voltage.
Figure 5:
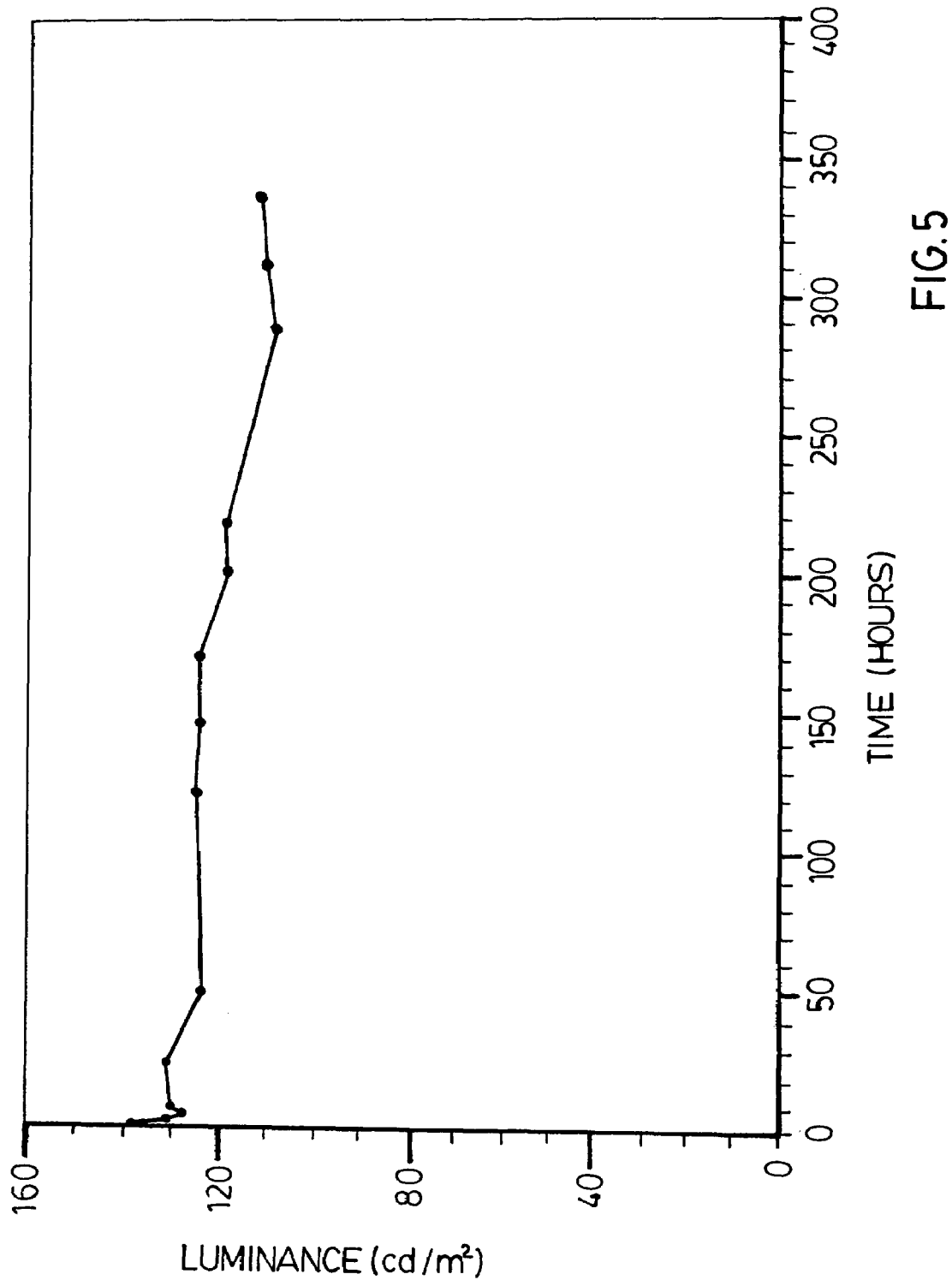
FIG. 5 is a graph showing the luminance of a thick film dielectric electroluminescent device incorporating a phosphor composition deposited by a method of the present embodiments as a function of operating time.

The completed device was tested using the procedure of example 1. FIG. 4 shows the luminance as a function of applied voltage at a pulse repetition rate of 240 Hz for one device and FIG. 5 shows the luminance as a function of operating time up to 200 hours for another device driven with a voltage 60 volts above its electroluminescent threshold voltage. The luminance during this time showed very little degradation.

TABLE 1

| Run # | Ar/H$_2$S | Composition (%) | | | | | Al/Ba | Luminance (cd/m$^2$) | CIE (y) | Threshold Voltage |
|---|---|---|---|---|---|---|---|---|---|---|
| | | Ba | Al | S | Eu | O | | | | |
| 1 | 2.83 | 7.76 | 42.00 | 38.06 | 0.87 | 11.33 | 5.42 | 76 | 0.136 | 111 |
| 2 | 3.26 | 7.64 | 44.37 | 33.07 | 0.91 | 14.02 | 5.81 | 44 | 0.142 | 106 |
| 3 | 2.50 | 7.33 | 37.25 | 42.77 | 0.96 | 11.70 | 5.08 | 170 | 0.139 | 150 |
| 4 | 4.17 | 7.67 | 37.33 | 43.88 | 0.87 | 10.26 | 4.87 | 177 | 0.138 | 173 |
| 5 | 1.83 | 7.29 | 38.86 | 44.71 | 0.78 | 8.37 | 5.33 | 210 | 0.141 | 159 |
| 6 | 1.50 | 7.14 | 37.91 | 42.48 | 0.95 | 11.51 | 5.31 | 187 | 0.147 | 171 |
| 7 | 1.17 | 7.16 | 36.68 | 38.74 | 0.72 | 16.72 | 5.13 | 187 | 0.140 | 164 |
| 8 | 1.00 | 7.40 | 38.40 | 41.46 | 0.72 | 12.04 | 5.19 | 188 | 0.139 | 165 |
| 9 | 1.00 | 7.69 | 37.85 | 43.25 | 0.67 | 10.55 | 4.92 | 128 | 0.134 | 150 |

Although preferred embodiments have been described herein in detail, it will be understood by those skilled in the art that variations may be made thereto without departing from the spirit of the invention or the scope of the appended claims.

What is claimed is:

1. A physical vapour deposition method for the deposition of thioaluminate phosphor compositions, the method comprising:
   providing one or more source materials selected from the group consisting of an intermetallic barium aluminum compound, a barium aluminum alloy and a protected barium metal;
   providing an activator species;
   effecting physical vapour deposition of one or more source materials and said activator species in a sulfur vapour atmosphere as a thioaluminate phosphor composition on a selected substrate; and
   wherein the protected barium metal is a composite of a barium aluminum alloy and an aluminum metal or a barium metal covered with a volatile passivating film.

2. The method of claim 1, wherein said one or more source materials is selected from a sputtering target and an evaporation pellet.

3. The method of claim 1, wherein said one or more source materials is an intermetallic barium aluminum compound is selected from the group consisting of BaAl$_4$, Ba$_7$Al$_{13}$ and Ba$_4$Al$_5$.

4. The method of claim 3, wherein said intermetallic barium aluminum compound is BaAl$_4$.

5. The method of claim 1, wherein said one or more source materials is a barium aluminum alloy of the formula Ba$_x$Al where x is in the range of about 0.15 to about 0.45.

6. The method of claim 5, wherein x is in the range of about 0.20 to about 0.35.

7. The method of claim 1, wherein said one or more source materials is a protected barium metal comprising a composite of a barium aluminum alloy and aluminum metal.

8. The method of claim 1, wherein said one or more source materials is a protected barium metal comprising barium metal covered with a volatile passivating film.

9. The method of claim 8, wherein said volatile passivating film is a layer of a non-protic solvent.

10. The method of claim 8, wherein said volatile passivating film is a layer of barium oxide, barium sulfate or inert barium compound.

11. The method of claim 1, wherein said one or more source materials further comprises aluminum metal or aluminum sulfide.

12. The method of claim 1, wherein said phosphor composition is a barium thioaluminate.

13. The method of claim 1, wherein said sulfur vapour atmosphere is H$_2$S.

14. The method of claim 13, wherein said sulfur vapour atmosphere is generated remotely from said source materials.

15. The method of claim 14, wherein said sulfur vapour atmosphere is generated from a polysulfide compound.

16. The method of claim 1, wherein said deposition is effected by a method selected from sputtering, thermal evaporation and electron beam evaporation.

17. The method of claim 16, wherein said method is sputtering.

18. The method of claim 16, wherein said method is thermal evaporation.

19. The method of claim 1, wherein said activator species is selected from europium and cerium.

20. The method of claim 19, wherein said activator species is europium.

21. The method of claim 19, wherein said activator species is incorporated within said one or more source materials.

22. The method of claim 19, wherein said activator species is provided separate from said one or more source materials.

23. The method of claim 3, wherein said method comprises a single source material of an intermetallic compound of BaAl$_4$, said activator species is provided doped within said compound and a sulfur source is incorporated within said compound.

24. The method of claim 3, wherein said method comprises a single source material comprising an intermetallic compound of $BaAl_4$, an activator species and sulfur.

25. A physical vapour deposition method for the deposition of thioaluminate phosphor compositions, the method comprising:
   providing one or more source materials selected from the group consisting of an intermetallic barium aluminate compound, a barium aluminum alloy, a protected barium metal and combinations thereof;
   providing an activator species to said one or more source materials or separately;
   effecting physical vapour deposition in a sulfur vapour atmosphere of said source materials and said activator species as a thioaluminate phosphor composition on a selected substrate; and
   wherein the protected barium metal is a composite of a barium aluminum alloy and an aluminum metal or a barium metal covered with a volatile passivating film.

26. The method of claim 25, wherein said one or more source materials is an intermetallic barium aluminum compound is selected from the group consisting of $BaAl_4$, $Ba_7Al_{13}$ and $Ba_4Al_5$.

27. The method of claim 26, wherein said intermetallic barium aluminum compound is $BaAl_4$.

28. The method of claim 25, wherein said one or more source materials is a barium aluminum alloy of the formula $Ba_xAl$ where x is in the range of about 0.15 to about 0.45.

29. The method of claim 28, wherein x is in the range of about 0.20 to about 0.35.

30. The method of claim 25, wherein said one or more source materials is a protected barium metal comprising a composite of a barium aluminum alloy and aluminum metal.

31. The method of claim 25, wherein said one or more source materials is a protected barium metal comprising barium metal covered with a volatile passivating film.

32. The method of claim 31, wherein said volatile passivating film is a layer of a non-protic solvent.

33. The method of claim 31, wherein said volatile passivating film is a layer of barium oxide, barium sulfate or inert barium compound.

34. The method of claim 25, wherein said one or more source materials further comprises aluminum metal or aluminum sulfide.

35. The method of claim 25, wherein said phosphor composition is a barium thioaluminate.

36. The method of claim 25, wherein said sulfur vapour atmosphere is $H_2S$.

37. The method of claim 36, wherein said sulfur vapour atmosphere is generated remotely from said source materials.

38. The method of claim 37, wherein said sulfur vapour atmosphere is generated from a polysulfide compound.

39. The method of claim 25, wherein said deposition is effected by a method selected from sputtering, thermal evaporation and electron beam evaporation.

40. The method of claim 25, wherein said activator species is selected from europium and cerium.

41. The method of claim 40, wherein said activator species is europium.

42. The method of claim 40, wherein said activator species is incorporated within said one or more source materials.

43. The method of claim 40, wherein said activator species is provided separate from said one or more source materials.

44. A physical vapour deposition method for the deposition of a barium thioaluminate phosphor composition, the method comprising:
   providing $BaAl_4$ as a source material and an activator species; and
   effecting vapour deposition of said source material and said activator species as a barium thioaluminate phosphor composition on a selected substrate in a sulfur vapour atmosphere.

45. The method of claim 44, wherein said sulfur vapour atmosphere is $H_2S$.

* * * * *